United States Patent [19]
Brothers Jr.

[11] Patent Number: 4,945,542
[45] Date of Patent: Jul. 31, 1990

[54] LASER DIODE MODULATOR

[75] Inventor: Louis R. Brothers Jr., Boston, Mass.

[73] Assignee: Massachusetts Institute of Technology, Cambridge, Mass.

[21] Appl. No.: 359,492

[22] Filed: May 31, 1989

[51] Int. Cl.$^5$ ............................ H01S 3/00; H01S 3/10
[52] U.S. Cl. ........................................ 372/38; 372/26; 372/29; 372/33; 372/82
[58] Field of Search .................... 372/9, 26, 29, 33, 38, 372/43, 81, 82

[56] References Cited

U.S. PATENT DOCUMENTS

| | | | |
|---|---|---|---|
| H,436 | 2/1988 | Milberger et al. | 372/38 |
| 3,648,073 | 3/1972 | Sams et al. | 372/38 |
| 3,898,583 | 8/1975 | Shuey | 372/38 |
| 4,243,952 | 1/1981 | Patterson | 372/38 |
| 4,709,370 | 11/1987 | Bednarz et al. | 372/38 |
| 4,796,264 | 1/1989 | Suzuki | 372/38 |

FOREIGN PATENT DOCUMENTS

| | | | |
|---|---|---|---|
| 0210682 | 12/1982 | Japan | 372/38 |
| 0190085 | 11/1983 | Japan | 372/38 |
| 0247982 | 12/1985 | Japan | 372/38 |
| 0104186 | 5/1987 | Japan | 372/43 |

Primary Examiner—William L. Sikes
Assistant Examiner—Georgia Y. Epps
Attorney, Agent, or Firm—Henry D. Pahl, Jr.

[57] ABSTRACT

The laser diode modulator disclosed herein employs a series of field-effect transistors provided with an input circuit utilizing a succession of inductive elements arranged to form a lumped element transmission line of essentially constant characteristic impedance. The drain or output terminals of the transistors drive an output circuit employing a series of inductive elements which, together with shunt capacitors, form a singly terminated filter providing a graduated and decreasing characteristic impedance. The laser diode is connected as the termination of the filter.

3 Claims, 1 Drawing Sheet

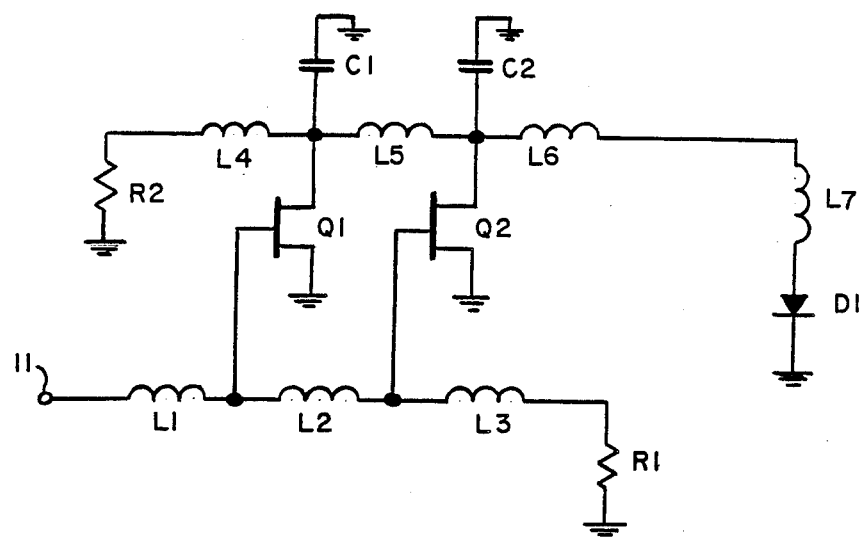

LASER DIODE MODULATOR

The Government has rights in this invention pursuant to contract Number F19628-85-C-0002 awarded by the Department of the Air Force.

BACKGROUND OF THE INVENTION

The present invention relates to laser diodes and more particularly to a modulator for energizing such diodes at high frequencies and wide bandwidth.

Laser diodes are increasingly being employed for signal and data transmission, particularly in conjunction with fiber optic links. As the optical links are improved, it becomes increasingly important to develop methods of modulating the light sources which are needed to utilize such links.

Many intrinsic semiconductor lasers have large potential modulation bandwidths but are difficult to modulate due to their low impedance. Typically, the signal energizing the diode is applied through a bond wire. The parasitic inductance of the bond wire tends to dominate the small signal input impedance at microwave frequencies. The diode thus appears as a series combination of an inductance and a small resistance, e.g. 5 ohms.

Heretofore, it has been typical to utilize a resistor in series with a laser diode in order to realize an apparent input impedance of approximately 50 ohms, an impedance which is consistent with most current high frequency signalling schemes. This method is highly inefficient since most of the power is dissipated in the matching resistor. Further, the length of the bond wire imposes an upper frequency limit due to the parasitic inductance noted above.

Among the several objects of the present invention may be noted the provision of apparatus for modulating a laser diode at relatively high, e.g. microwave, frequencies; the provision of such apparatus which is relatively efficient in coupling power into the laser diode; the provision of such apparatus which avoids limitations otherwise imposed by the presence of a bond wire for coupling electrical signals to the diode itself; the provision of such apparatus which accepts a modulating signal at conventional impedance levels; the provision of such apparatus which is highly reliable and which is of relatively simple and inexpensive construction. Other objects and features will be in part apparent and in part pointed out hereinafter.

SUMMARY OF THE INVENTION

In a laser diode modulator constructed in accordance with the present invention, the modulating signal is applied to an input circuit comprising a series of inductive elements. The gate terminals of successive ones of a series of field-effect transistors are connected to the input circuit between successive ones of the inductive elements. The inductive elements and the input capacitances of the transistors in effect form a lumped element transmission line. The modulator also includes an output circuit comprising a series of inductive elements, the drain terminals of successive ones of the transistors being connected to the output circuit between successive ones of those inductive elements. A tuning capacitor shunts each of the transistor drain terminals and the output circuit inductive elements form, with the tuning capacitor, a singly terminated filter providing a graduated and decreasing characteristic impedance. The laser diode to be modulated is then connected to the low impedance end of the output circuit.

BRIEF DESCRIPTION OF THE DRAWING

The single figure is a schematic circuit diagram of a laser diode modulator constructed in accordance with the present invention.

DESCRIPTION OF THE PREFERRED EMBODIMENT

Referring now to the drawing, the laser diode modulator illustrated there employs a series of field-effect transistors, two in the particular embodiment illustrated. These transistors are designated by reference characters Q1 and Q2 and preferably are so-called high electron mobility transistors (HEMT) such as the NEC202 manufactured and sold by the Nippon Electric Co. In the diagram the d.c. biasing elements are omitted and only the a.c. components are shown.

The signal which is to control or modulate the laser diode is applied, e.g. at a terminal 11, to an input circuit, which comprises a series of inductive elements, these elements being designated by reference characters L1, L2 and L3. The input or gate terminals of the successive transistors are connected to the input circuit between successive ones of said inductive elements, as illustrated. The values of the inductive elements are chosen in relation to the inherent input or gate terminal shunt capacitances of the particular transistors used so as to form a lumped element transmission line of essentially constant characteristic impedance. In the particular embodiment illustrated, this characteristic impedance is chosen to be 50 ohms so as to be compatible with typical or conventional signal sources at the high frequencies contemplated. Representative values for the inductive elements and the transistor input capacitances, designated CG, are given hereinafter in Table 1. The transmission line is terminated with its characteristic impedance (of 50 ohms) as indicated by the resistor R1.

The transistors Q1 and Q2 drive an output circuit comprising a series of inductive elements, these elements being designated by the reference characters L4–L6. The drain terminals of successive ones of the transistors are connected to the output circuit between successive ones of the output circuit inductive elements. Tuning capacitors C1 and C2 shunt the drain terminals of respective ones of the transistors Q1 and Q2. These tuning capacities shunt and are thus in effect added to the inherent drain capacitance (designated CD) of each of the transistors Q1 and Q2.

As contrasted with the input circuit, however, the output circuit component values are selected to form a singly terminated filter network providing a graduated and decreasing characteristic impedance, i.e. proceeding from left to right as shown in the drawing. Consistent with this decreasing characteristic impedance, the values of the series inductances and shunt capacitances progressively increase. The laser diode to be modulated is connected to the right hand or low impedance end of the singly terminated filter. The diode itself is represented by reference character D1 while the inductance of its typical bondwire is indicated by reference character L7. In selecting the value of the last inductive element in the output circuit, the bond lead inductance L7 is taken into consideration or included with L6 in the overall design of the singly terminated filter network so that the desired high current feed to the low terminating resistance is achieved. While particular component values for the particular embodiment being described are given hereinafter in Table 1, the general considerations for the design of such filters is given in the *Handbook of Filter Synthesis* by Anatol I. Zverev published and copyrighted in 1967 by John Wiley and Sons, Inc.

The left hand side of the filter network, i.e. the end which would normally be the input if it were a passive filter, is terminated by a relatively high impedance by the resistor R2 i.e. 100 ohms in the particular embodiment illustrated by the resistor R2.

At the very high modulating frequencies contemplated, e.g. 30 giga hertz, the inductive elements L1-L6 are preferably implemented by strip line techniques, and consistent with such implementation, Table 1 gives values for these components in wavelength ($\lambda$) as well as in conventional inductive values, i.e. nanohenrys.

TABLE 1

| L1, L3 | 0.187 | nanohenrys |
| | or 0.065 | |
| L2 | 0.375 | nanohenry |
| | or 0.115 | |
| L4 | 0.163 | nanohenry |
| | or 0.049 | |
| L5 | 0.731 | nanohenry |
| | or 0.182 | |
| L6 | 0.818 | nanohenry |
| | or 0.092 | |
| L7 | 0.503 | nanohenry |
| CG | 0.15 | picofarad |
| CD | 0.08 | picofarad |
| C1 | 0.047 | picofarad |
| C2 | 0.089 | picofarad |

In certain respects, the operation of the modulator illustrated is somewhat analogous to a traveling wave amplifier in that the phase velocity of signals traveling across the input and output circuits are roughly matched so that the contributions made to the output signal by the successive transistors are substantially additive. The conventional traveling wave amplifier, however, would provide a very poor impedance match to a device such as a laser diode. Conversely, while a passive singly terminated filter might provide a reasonable impedance match, voltage reflections would be severe and would limit bandwidth. In the construction of the present invention, however, the relatively small parasitic capacitance between the gate and drain each of of the transistors Q1 and Q2 provides relatively high isolation which defeats such reflections.

In view of the foregoing, it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A laser diode modulator comprising:
a series of transistors; each having an input terminal and an output terminal, the input terminals exhibiting a characteristic shunt capacitance;
an input circuit for receiving a modulating signal, said input circuit comprising a series of inductive elements, the input terminals of successive ones of said transistors being connected to said input circuit between successive ones of said inductive elements;
an output circuit comprising a series of inductive elements, the output terminals of successive ones of said transistors being connected to said output circuit between successive ones of the inductive elements; and
a tuning capacitor shunting each of said transistor output terminals, the values of said output circuit inductive elements forming, with said tuning capacitors, a singly terminated filter providing a graduated and decreasing characteristic impedance, the laser diode to be modulated being connected to the low impedance end of said output circuit.

2. A laser diode modulator comprising:
a series of field effect transistors;
an input circuit comprising a series of inductive elements, the gate terminals of successive ones of said transistors being connected to said input circuit between successive ones of said inductive elements, said inductive elements and the input capacitances of said transistors forming a transmission line of essentially constant characteristic impedance with the modulating signal being applied to one end of said line;
means for terminating the other end of said transmission line with its characteristic impedance;
an output circuit comprising a series of inductive elements, the drain terminals of successive ones of said transistors being connected to said output circuit between successive ones of the inductive elements;
a tuning capacitor shunting each of said drain terminals;
the values of said output circuit inductive elements forming, with said tuning capacitors and the inherent drain capacitances of said transistors, a singly terminated filter providing a graduated and decreasing characteristic impedance; and
means for terminating the end of said output circuit corresponding to said one end of said input circuit with an impedance which is relatively high in relation to the resistance characteristic of said laser diode, the laser diode to be modulated being connected to the end of said output circuit which is opposite the terminated end.

3. A laser diode modulator comprising:
a series of high electron mobility field effect transistors;
an input circuit for receiving a modulating signal, said input circuit comprising a series of inductive elements, the gate terminals of successive ones of said transistors being connected to said input circuit between successive ones of said inductive elements, said inductive elements and the input capacitances of said transistors forming a transmission line of essentially constant characteristic impedance with the modulating signal being applied to one end of said line;
means for terminating the other end of said transmission line with its characteristic impedance;
an output circuit comprising a series of inductive elements, the drain terminals of successive ones of said transistors being connected to said output circuit between successive ones of said inductive elements, the successive inductive elements being of increasing values of inductance;
shunting each of the drain terminals of the successive transistors, a respective tuning capacitor, the successive capacitors being of increasing values of capacitance;

the values of said output circuit inductive elements forming, with said tuning capacitors and the inherent drain capacitances of said transistors, a singly terminated filter providing a graduated and decreasing characteristic impedance, and means for terminating the end of said output circuit corresponding to said one end of said input circuit with an impendance which is relatively high in relation to the resistance characteristic of said laser diode resistance, the laser diode to be modulated being connected to the end of said output circuit which is opposite the terminated end.

* * * * *